United States Patent
Li et al.

(10) Patent No.: US 11,694,749 B2
(45) Date of Patent: *Jul. 4, 2023

(54) METHODS AND SYSTEMS FOR AN ANALOG CAM WITH FUZZY SEARCH

(71) Applicant: Hewlett Packard Enterprise Development LP, Houston, TX (US)

(72) Inventors: Can Li, Palo Alto, CA (US); Catherine Graves, Milpitas, CA (US); John Paul Strachan, San Carlos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/302,439

(22) Filed: May 3, 2021

(65) Prior Publication Data
US 2021/0327508 A1    Oct. 21, 2021

Related U.S. Application Data

(63) Continuation of application No. 16/744,136, filed on Jan. 15, 2020, now Pat. No. 10,998,047.

(51) Int. Cl.
G11C 15/04    (2006.01)
G11C 15/00    (2006.01)

(52) U.S. Cl.
CPC .............. G11C 15/04 (2013.01); G11C 15/00 (2013.01)

(58) Field of Classification Search
CPC ........ G11C 15/04; G11C 15/00; G11C 15/046
(Continued)

(56) References Cited

U.S. PATENT DOCUMENTS 6,288,922 B1    9/2001    Wong et al.
6,442,090 B1    8/2002    Ahmed et al.
(Continued)

FOREIGN PATENT DOCUMENTS

CN    109637571 A  *  4/2019    ............ G11C 15/04
CN    110191135 A  *  8/2019

OTHER PUBLICATIONS

Bahloul et al., "Hardware Emulation of Memristor Based Ternary Content Addressable Memory," 2017 14th International Multi-Conference on Systems, Signals & Devices (SSD), Dec. 13, 2017, pp. 446-449.
(Continued)

Primary Examiner — Fernando Hidalgo
(74) Attorney, Agent, or Firm — Sheppard Mullin Richter & Hampton LLP

(57) ABSTRACT

Systems are methods are provided for implementing an analog content addressable memory (analog CAM), which is particularly structured to allow for an amount of variance (fuzziness) in its search operations. The analog CAM may search for approximate matches with the data stored therein, or matches within a defined variance. Circuitry of the analog CAM may include transistor-source lines that receive search-variance parameters, and/or data lines that receive search-variance parameters explicitly within the search input data. The search-variance parameters may include an upper bound and a lower bound that define a range of values within the allotted amount of fuzziness (e.g., deviation from the stored value). The search-variance parameters may program (using analog approaches) the analog CAM to perform searches having a modifiable restrictiveness that is tuned dynamically, as defined by the input search-variance. Thus, highly efficient hardware for complex applications involving fuzziness are enabled.

20 Claims, 13 Drawing Sheets

(58) Field of Classification Search
USPC .................................................. 365/49.17
See application file for complete search history.

(56) References Cited

U.S. PATENT DOCUMENTS

| | | | |
|---|---|---|---|
| 6,985,372 | B1 | 1/2006 | Blyth et al. |
| 7,050,317 | B1 | 5/2006 | Lien et al. |
| 7,206,212 | B1 | 4/2007 | Chou |
| 7,272,684 | B1 | 9/2007 | Chou |
| 7,554,844 | B2 | 6/2009 | Werner et al. |
| 7,899,978 | B2 | 3/2011 | Pandya |
| 8,165,924 | B2 | 4/2012 | Smyers et al. |
| 8,654,555 | B2 | 2/2014 | Shin et al. |
| 9,543,013 | B1 | 1/2017 | Govindaraj et al. |
| 9,613,701 | B2 | 4/2017 | Roy et al. |
| 9,721,661 | B1 | 8/2017 | Buchanan et al. |
| 10,051,093 | B2 | 8/2018 | Guo et al. |
| 10,340,007 | B2 | 7/2019 | Salama et al. |
| 10,896,731 | B1 | 1/2021 | Li et al. |
| 10,998,047 | B1 * | 5/2021 | Li .................... G11C 15/00 |
| 2005/0169095 | A1 | 8/2005 | Bedeschi et al. |
| 2013/0054886 | A1 | 2/2013 | Eshraghian et al. |
| 2014/0092664 | A1 | 4/2014 | Bourianoff et al. |
| 2016/0284408 | A1 | 9/2016 | Chiou et al. |
| 2017/0060438 | A1 * | 3/2017 | Igaue .................... G11C 15/04 |
| 2018/0040374 | A1 | 2/2018 | Zheng et al. |
| 2020/0075099 | A1 | 3/2020 | Choi et al. |
| 2020/0258587 | A1 | 8/2020 | Li et al. |
| 2022/0122646 | A1 | 4/2022 | Graves et al. |
| 2022/0138204 | A1 | 5/2022 | Graves et al. |

OTHER PUBLICATIONS

Bandi, N. et al., "Hardware Acceleration of Database Operations Using Content-Addressable Memories," Proceedings of the First International Workshop on Data Management on New Hardware (DaMoN 2005); Jun. 12, 2005, https://dl.acm.org/doi/pdf/10.1145/1114252.1114262.

Bu, L. et al., "A Keyword Match Processor Architecture using Content Addressable Memory," Proceedings of the 14th ACM Great Lakes symposium on VLSI, Apr. 26-28, 2004, pp. 372-376, https://dl.acm.org/doi/pdf/10.1145/988952.989042.

Chiao-Ying Huang, "Ternary Content-addressable Memory Circuits," Midterm Report—IEE5009: Memory System, Institute of Electronics, National Chiao-Tung University, Fall 2012, pp. 1-7.

Guo et., "A Resistive TCAM Accelerator for Data-Intensive Computing," Micro'11 Dec. 3-7, 2011, 12 pages.

Han et al., "A Novel Ternary Content Addressable Memory Design Based on Resistive Random Access Memory With High Intensity and Low Search Energy," Japanese Journal of Applied Physics, Apr. 2018, vol. 57, No. 4S, pp. 04FE02-1-04FE02-5.

Harada et al., "A Content-addressable Memory Using "Switched Diffusion Analog Memory with Feedback Circuit"," IEICE Trans. Fundamentals, vol. E82-A, No. 2, Feb. 1999, pp. 370-377.

Li et al., "NVSim-CAM: A Circuit-Level Simulator for Emerging Nonvolatile Memory based Content-Addressable Memory," 2016 IEEE/ACM International Conference on Computer-Aided Design (ICCAD), Nov. 7, 2016, 7 pages.

Lin et al., "Random Forest Architectures on FPGA for Multiple Applications," GLSVLSI '17: Proceedings of the on Great Lakes Symposium on VLSI 2017, May 10-12, 2017, pp. 415-418.

Lucchese et al., "QuickScorer: A Fast Algorithm to Rank Documents with Additive Ensembles of Regression Trees," Proceedings of the 38th International ACM SIGIR Conference on Research and Development in Information Retrieval, Aug. 2015 pp. 73-82.

Rusch et al., "The Design of an Analog Associative Memory Circuit for Applications in High-dimensional Computing," Technical Report No. UCB/EECS-2018-72, University of California, May 18, 2018, 28 pages.

Shen et al., "A Hybrid TCAM + SRAM Scheme for Multi-Match Packet Classification," 2012 13th International Conference on Parallel and Distributed Computing, Applications and Technologies, Dec. 14-16, 2012, pp. 685-690.

Zhao et al., "RFAcc: A 3D ReRAM Associative Array based Random Forest Accelerator," International Conference on Supercomputing (ICS '19), Jun. 26-28, 2019, 11 pages.

Li et al., "Analog content addressable memories with memristors", Nature communications, 2020, 22 pages.

Li et al., "Analog content-addressable memories with memristors", Nature Communications, 2020, 8 pages.

* cited by examiner

METHODS AND SYSTEMS FOR AN ANALOG CAM WITH FUZZY SEARCH

CROSS REFERENCE TO RELATED APPLICATIONS

This application is a continuation of U.S. patent application Ser. No. 16/744,136, filed on Jan. 15, 2020 the contents of which is incorporated herein by reference in its entirety.

DESCRIPTION OF RELATED ART

Content addressable memory (CAM) is a type of computing memory in which the stored data is not accessed by its location, but rather by its content. A word, or "tag", is input into the CAM, the CAM searches for the tag in its contents, and when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
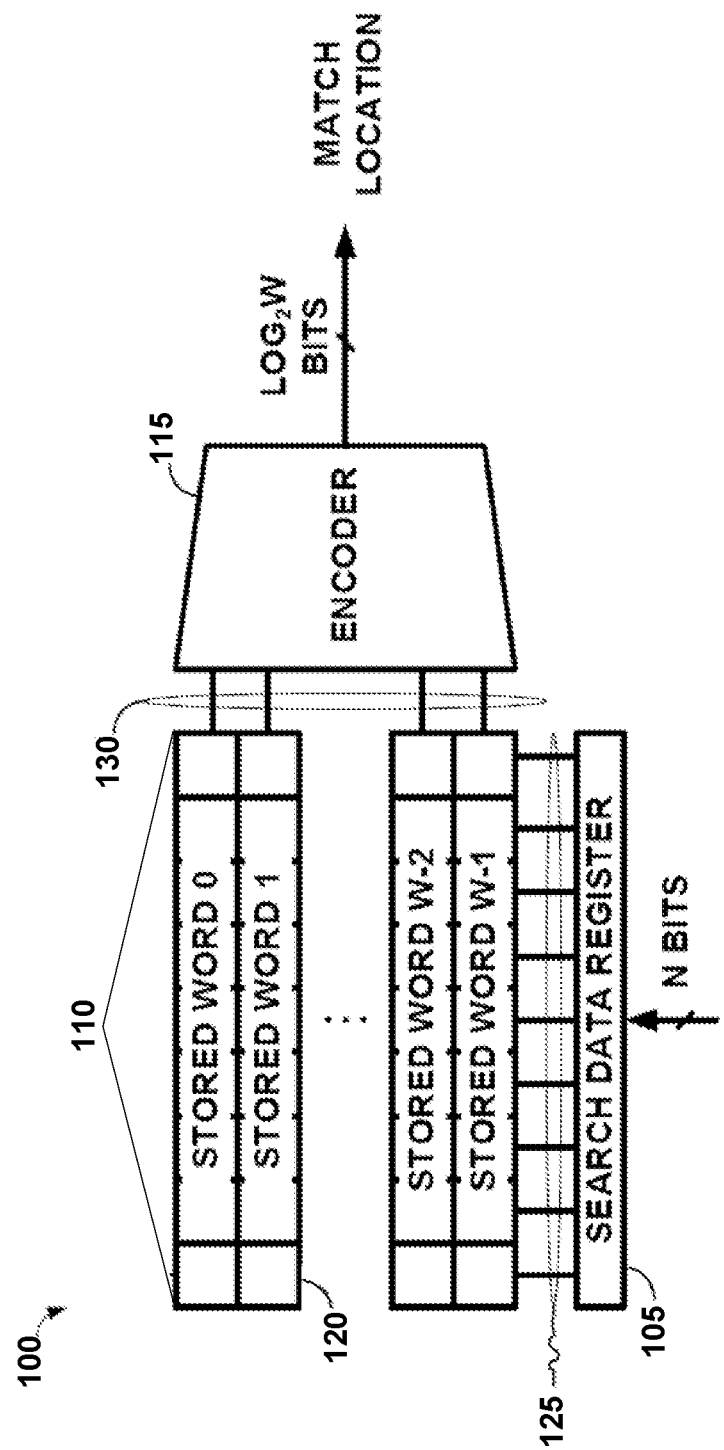
FIG. 1 depicts a diagram of an example of an analog content addressable memory (analog CAM), according to some embodiments.

The figures are not exhaustive and do not limit the present disclosure to the precise form disclosed.

DETAILED DESCRIPTION

Various embodiments described herein are directed to an analog content addressable memory (analog CAM), which is particularly structured to allow for an amount of variance (also referred to herein as fuzziness) in its search operations. For example, the analog CAM with fuzziness features, as disclosed herein, have the capability to search for approximate matches, or matches within some degree of fuzziness. In other words, aspects of the fuzziness features allow the analog CAM to return matches, even in cases when a value of the search input data deviates from the actual value of the data stored therein (e.g., within a certain range of search-variance or fuzziness). Even further, the disclosed analog CAM with fuzziness features is optimized for use with applications that involve searching with a level of uncertainty, or otherwise do not require searches to be restricted to exact matches. Example of such applications, where the use of the disclosed analog CAM may be optimal, is genomic sequencing, associative memory, probabilistic processing, and the like.

The analog CAM disclosed herein is distinctly structured to perform searches that extend beyond the common capabilities of many existing ternary content-addressable memories (TCAMs). By implementing tunable search-variance parameters, the disclosed analog CAM is capable of searching data for matches, while allowing for a tunable uncertainty, thereby enabling high efficient hardware for complex applications involving "fuzziness". The tunable search-variance parameters may include an upper bound and a lower bound, which serve as the limits (upper and lower) defining a range of values. This range of values can be considered within the allotted amount of fuzziness, or within a deviation of the searched value from the actual stored value. In some embodiments, these tunable search-variance parameters are implemented as voltages received via transistor source lines of an analog CAM cell. The search-variance parameters can be used to program (using analog approaches) the analog CAM to perform searches having a modifiable restrictiveness that is tuned dynamically, as defined by the input search-variance. As an example, tuning the search-variance parameters in a manner that increases a variance range (e.g., including larger deviation from the stored analog values) programs the analog CAM for broadened search operations.

Alternatively, tuning the search-variance parameters to a decreased variance range (e.g., including smaller deviation from the stored analog values) programs the analog CAM to perform more restrictive search operations. Furthermore, by implementing the search-variance parameters as input into the analog CAM (as opposed to stored values and/or static values), an amount of variance that is applied to a search operation can be dynamically adjusted. As a consequence, the disclosed analog CAM can be easily re-programmed to modify its search (with respect to the amount of allowed variance), thereby realizing greater flexibility of the circuitry for use with various types of applications requiring varying degrees of "uncertainty" or "fuzziness".

Referring now to FIG. 1, an example of a CAM is illustrated. As a general description, CAMs are hardware that compare input patterns against its stored data. The memory that stores the data in the CAM may also perform the search operation at the same location, eliminating expensive data transfer between different units in conventional hardware. During the search, memory cells may operate in parallel, which can lead to massive throughput with applications in real-time network traffic monitoring, access control lists (ACL), associative memoires, and the like.

CAMs can be implemented in technologies that permit the CAM to store its contents, even when power is lost or otherwise removed. Thus, a CAM's data "persists" and can act as a "non-volatile memory." These technologies include, for instance, resistive switching memory (i.e., memristor), phase change memory, magnetoresistive memory, ferroelectric memory, some other resistive random access memory device, or combinations of those technologies.

CAMs can be categorized as "binary" or "ternary." A binary CAM (BCAM), operates on an input pattern containing binary bits of "0" and "1". Additionally, a TCAM operates on an input pattern (and stores data) containing not only binary bits of "0" and "1", but also an "X" value. An "X" is sometimes referred to as a "don't care" or a "wildcard". In a search on the input pattern in a TCAM, an "X" will return a match on either a "0" bit or a "1" bit. Thus, a search on the pattern "10X1" will return a match for both "1001" and "1011". Note that both BCAMs and TCAMs use and operate on binary values of "0" and "1". CAMs are digital in that the data are stored in the CAM as binary values in a memory (e.g., SRAM, memristor, etc.) and the input patterns are represented by binarized logic '0's and '1's. Each memory cell in the CAM processes one value at a time (either 0/1 or 0/1/X), which limits the memory density and power efficiency.

Referring back to FIG. 1, an example of a CAM 100 that can implement the searching techniques and features disclosed herein is illustrated. The CAM 100, shown in the illustrated example, can be used in a digital application in which search patterns and the values stored in the CAM 100 are digital.

The CAM 100 can include a search data register 105, an analog memory cell array 110, and an encoder 115. The analog cell array 110 stores W "stored words" 0 through W-1. Each stored word is a pattern of values, at least some of which may be analog values as described below. The search data register 105, in use, may be loaded with an analog or binary input pattern that can be searched from among the contents of analog cell array 110. The example of FIG. 1 operates on a binary input pattern as indicated by the 'n bits' going to the data line register. An example operating on an analog search pattern is discussed further below. Thus, for example, instead of storing two bits of data in two columns as in the case for a digital CAM, one column of an analog CAM may encode four values.

The analog cell array 110 includes a plurality of analog cells 120 (only one is indicated in FIG. 1) arranged in rows and columns. A configuration for the analog cells 120 within the CAM is more prominently shown and described in further detail in reference to FIG. 2A. During a search, the analog input pattern loaded into the search data register 105 is communicated to the analog cell array 110 over a plurality of search lines 125. Some examples may use data lines in addition, or in lieu, of search lines. Each cell 120 then indicates whether a value of the analog input pattern is matched by a range of values contained in the cell (e.g., the range of values including non-binary values).

The indications of whether the cells contain matches are communicated to the encoder 115 over a plurality of match lines 130. Note that a match is found if the searched word (or pattern) matches the stored word within a single row. The match lines do not output the matches of individual cells, but outputs whether the stored row word matches the searched data of the row. More particularly, match lines 130 are pre-charged high along rows, data is searched on search lines 125 (or data lines) along columns, and if a mismatch between searched and stored content occurs, the match line 130 discharges and goes low. If a match occurs, the match line 130 stays high.

The encoder 115 is a priority encoder that returns a match location within the analog cell array 110. Note that the encoder 115 may be omitted in some examples, particularly in examples in which multiple match locations are identified and desired. For instance, because the "don't care" values may be included in the input pattern, multiple matches among the W stored words may be found. Some examples might wish to identify more than one, or even all, match locations and these examples would omit the encoder 115.

Figure 2A:
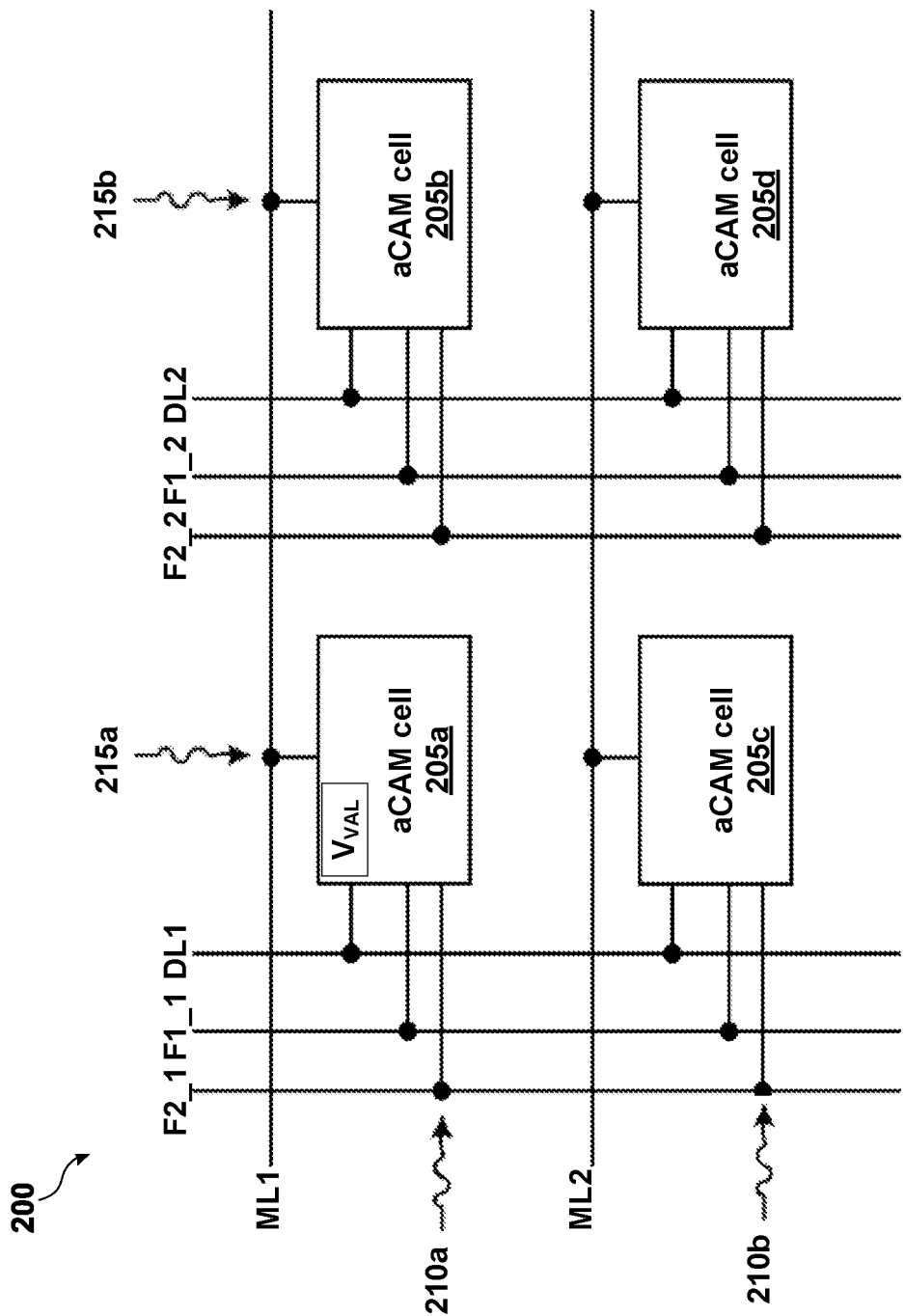
FIG. 2A illustrates an example analog CAM cell array that is particularly structured to implement tunable search variance (also referred to herein as fuzziness) features, and can be comprised by an analog CAM, such as the analog CAM depicted in FIG. 1, according to some embodiments.

In FIG. 2A, portions of an analog CAM cell array 200 within an analog CAM (shown in FIG. 1) is illustrated. As alluded to above, the analog CAM can search multi-level voltages and stores analog values in a nonvolatile memory, such as memristors (or programmable resistor). An analog CAM circuit can be driven with standard multi-level digital values, or directly with analog signals, giving additional potential for increased functionality while removing the need for expensive analog-digital conversion. The memristor-based analog CAM can search analog voltages and store analog values. In some cases, an analog CAM cell, for example each of the analog CAM cells 205a-205d, can implement a function that is equivalent to multiple digital CAM cells. This can lead to significant advantages in area and power saving in implementing certain CAM-based functions.

Typically, an analog CAM cell outputs a match when the analog input voltage exactly matches the value stored in the analog CAM cell. However, the disclosed analog CAM is specifically configured to implement fuzziness in its search operations. Accordingly, each of the analog CAM cells 205a-205d can output a match, even when the analog input voltage (conveying the search input data) does not exactly match the analog value stored within the respective analog CAM cells 205a-205d. That is, the fuzziness features allow the analog CAM cells 205a-205d to output a match when the analog input voltage is an approximate match to the stored analog value within an allotted variance range (or fuzziness), as defined by search-variance input parameters.

In particular, the disclosed analog CAM can match all values between an "upper bound" and a "lower bound" of variance, or within a variance range (where the range includes non-binary values). As referred to herein, variance describes an amount of difference (typically a small offset with respect to the magnitude of the value) between a search input value and the stored value, for instance, the analog value stored within analog CAM cells 205a-205d. As an example, data stored in the analog CAM cells 205a-205d can be encoded by a voltage 0.5 V. The analog CAM cells 205a-205d can receive search-variance parameters indicating a variance that is tuned to (+/−) 0.05 V, which governs the allowed fuzziness in the search operation. Thus, a corresponding variance range can include the analog values that are within the limits set by the search-variance parameters. Referring back to the example, the variance range (also referred to herein as the variance width) can include voltages within a range, as defined by the example lower bound of 0.45V and the example upper bound of 0.55V. These high and low limits can be set by applying voltages to input lines (including a drop-down transistor) of the analog CAM cells 205a-205d. Thus, variance can be received as input parameters by the analog CAM cells 205a-205d, which define the allotted fuzziness in the search, and so are referred to as search-variance parameters. It should be appreciated that the abovementioned values discussed in reference to the variance range are merely exemplary and other values and/or ranges may be possible.

Each of the analog CAM cells 205a-205d can include a memristor (shown in FIG. 3) that stores an analog value. According to the disclosed fuzziness features, this analog value corresponds to a target value that, in some cases, falls in between the values of the search-variance parameters (indicating a lower bound and an upper bound of variance). In other words, a target value stored by a memristor in each of the analog CAM cells 205a-205d can be centered about the upper and lower limits set by the search-variance parameters. For example, an analog value stored in the memristor of a cell can be a voltage that is a median of the variance range (e.g., mid-point in the variance width). Referring again to the previous example, if the target value stored by a cell's memristor is 0.5 V, the search-variance parameters can set the upper bound and the lower bound to have the same offset from this target value. For instance, the upper bound being 0.55 V (target value +0.05) and the lower bound being 0.45 V (target value −0.05). The number of equivalent digital cells or bits that can be stored in the analog CAM cells 205a-205b may depend on the number of states the memristor (programmable resistor) may be programmed to. To be able to encode the equivalent of n bits (e.g., n binary CAM/TCAM cells), a cell's memristor may have $2^n+1$ states.

In FIG. 2A, the example configuration shows four analog CAM cells 205a-205d that are arranged in an array 200. The array 200 includes rows 210a-210b, and columns 215a-215b (e.g., 2×2 array). Each of the respective rows 210a-210b, and columns 215a-215b are individually searchable over the data lines DL1 and DL2. The data lines DL1 and DL2 can receive an analog value that is intended to be searched by the analog CAM, which is conveyed via a voltage (e.g., $V_{DL}$) that can be applied on each data line, respectively. Whether a match is found between the search input data received via DL1 and DL2, and the data stored in the analog CAM cells within a particular row, is indicated over the match lines ML1 and ML2. For instance, a word on row 210a may indicate a match on the corresponding match line ML1 where a search against the data stored in each of the cells on the row 210a, namely analog CAM cells 205a-205b, matches. Although the configuration in FIG. 2A shows the array 200 as a 2×2 array for purposes of illustration, it should be appreciated that the analog CAM of the embodiments can be configured to include M (rows)×N (columns) array of analog cells, as deemed appropriate.

As described above, each of the analog CAM cells 202a-205d can include memristors (not shown) that can be used to store a target value. In FIG. 2A, an example of a target value is shown as $V_{VAL}$ which is particularly stored in analog CAM cell 205a. Stored target values that are encoded to a cell's memristor, such as $V_{VAL}$, can be an analog value. For purposes of discussion, the analog values described herein are voltages, but is should be understood that these values can be implemented as other analog characteristics, such as current and the like. Memristors can function as non-volatile electronic memory devices, whose resistance can be programmed. Thus, analog values can be stored by (or encoded on) the analog CAM cells 202a-205d using the conductance of the respective cell's memristor. For example, when the analog value for $V_{VAL}$ is stored by a memristor for analog CAM cell 205a, the analog number may be encoded in the cell via the conductance, or resistance threshold within which the analog value of the cell resides. Further, as an aspect of the fuzziness features described herein, the stored target value, such as $V_{VAL}$, may be a voltage that is selectable with respect to the intended fuzziness to be programmed for the analog CAM's search operation. For example, as previously discussed, $V_{VAL}$ may be a voltage that is the median value within a range of voltages that are defined as the variance allowed during the analog CAM's search.

FIG. 2A illustrates additional lines within the array 200, namely lines F2_1, F1_1, F2_2, and F1_2. These lines F2_1, F1_1, F2_2, and F1_2 are column lines that are particularly configured for receiving the tunable search-variance parameters implementing the fuzziness features. In the example, the search-variance parameters programmed via lines F2_1, F1_1 are fed into the cells of column 215a, shown as including analog CAM cells 205a, 205c. Similarly, lines F2_2 and F1_2 are fed into the cells of column 215b, shown as including analog CAM cells 205b, 205d. In operation, line F2_2 may receive an analog value that defines the higher bound portion of the search-variance parameters, and line F1_2 receives the analog value that defines the lower bound portion of the search-variance parameters to be received by column 215b. Also, line F2_1 may receive an analog value that defines the higher bound portion of the search-variance parameters, and line F1_1 receives the analog value that defines the lower bound portion of the search-variance parameters to be received by column 215a. In addition, lines F2_1, F1_1 may define particular search-variance parameters that are applied to the search input data of data line DL1, while lines F2_2, F1_2 may define particular search-variance parameters that may be applied to the search input data of data line DL2.

Figure 2B:
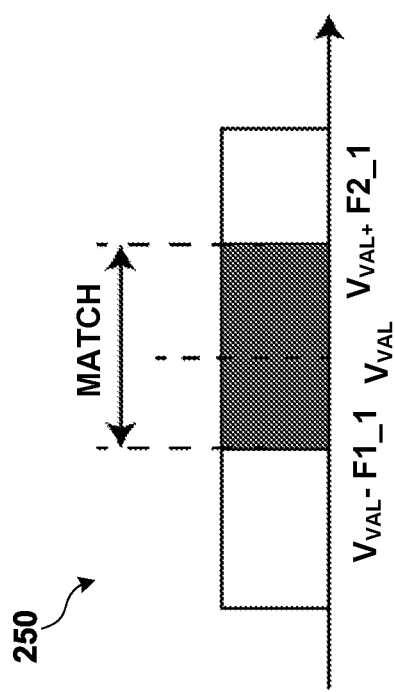
FIG. 2B is a conceptual diagram of an example range of voltages (e.g., variance range) that can be implemented by the analog CAM cell, as shown in FIG. 2A, to perform search operations that include a search variance (or fuzziness), according to some embodiments.

Similar to the search input data that is received by data lines DL1, and DL2 the search-variance parameters, received by lines F2_1, F1_1, F2_2, and F1_2 can be conveyed as analog signals, namely voltages. An example of a relationship between the search-variance parameters, and a target value ($V_{VAL}$) stored in resistors of the analog CAM cells 205a-205d is shown in FIG. 2B. For example, FIG. 2B is a conceptual depiction of voltages that can be within a width of a variance, or fuzziness, that can be programed into the analog CAM. In the example, the shaded portion of bar 250 represents a width for an allowable variance from a searched value. As described above, a variance's width (represented by the shaded portion of bar 250) can include a range of voltage values, having an upper limit that is defined mathematically as:

$$\text{Upper Limit} = V_{VAL} + f(V_{F2\_1}) \quad (1)$$

It should be understood that the fuzziness voltage is not an exact equivalent to the voltage on the line ($V_{F2\_1}$), but it is dependent on this voltage.

The variance's width (represented by the shaded portion of bar 250) can include a range of voltage values, having a lower limit that is defined mathematically as:

$$\text{Lower Limit} = V_{VAL} - f(V_{F1\_1}) \quad (2)$$

Accordingly, for a search against the analog value stored by analog CAM cell 205a, namely $V_{VAL}$, to result in a match, the voltage ($V_{DL1}$) applied on data line DL1 (representing the search input data) must be a voltage value that falls within the range of voltage values defined by these limits (inside of the shaded portion of bar 250). This tunable variance, or fuzziness, represented in FIG. 2B can also be represented mathematically as:

$$V_{VAL} - V_{F1\_1} \leq V_{DL1} \leq V_{VAL} + V_{F2\_1} \quad (3)$$

Thus, feeding the additional lines, such as lines F2_1, F1_1, F2_2, and F1_2 into the array 200 in FIG. 2A (and particularly manipulating the analog signals received via these lines within the circuitry) to receive the search-variance parameters are unique design features for the disclosed analog CAM (in that they are distinct to implementing the disclosed fuzziness features).

Figure 3:
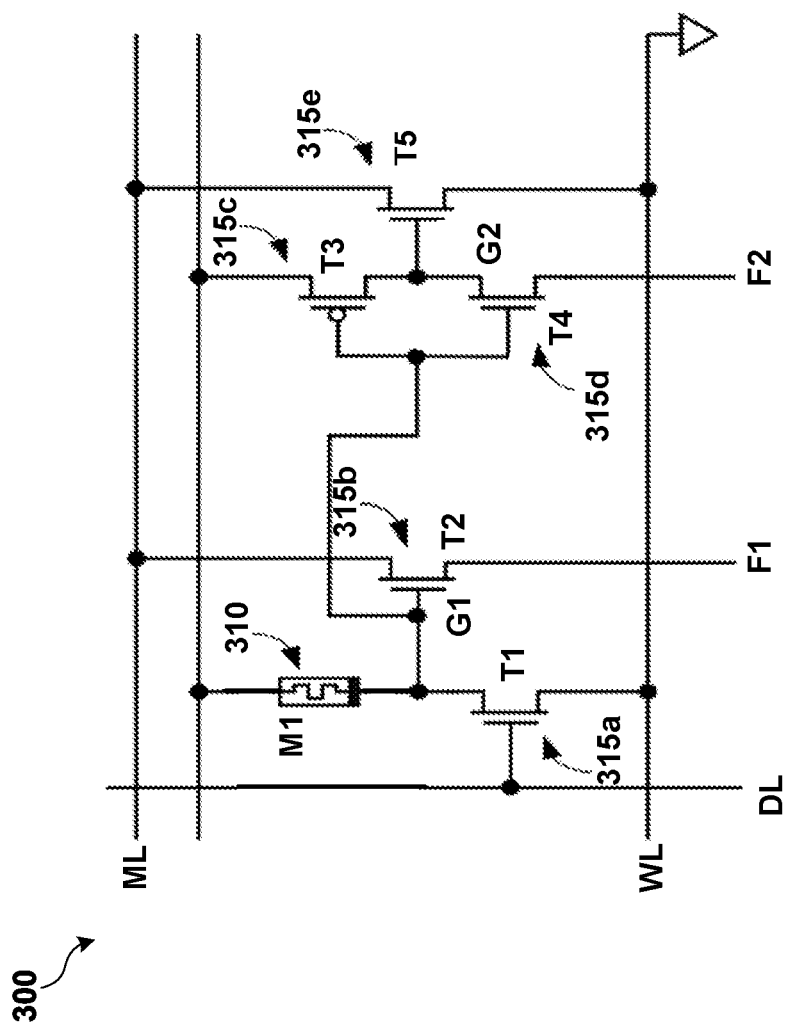
FIG. 3 illustrates an example of a circuit implementing an analog CAM cell, which is particularly configured to receive tunable search variance (or fuzziness) parameters via transistor source lines, according to some embodiments.

Referring now to FIG. 3, an example of a circuit configuration for an analog CAM cell (shown in FIG. 2A) is illustrated. Particularly, the example circuit 300 for the analog CAM cell is shown as having a 5T1M circuit implementation. In other words, the circuit 300 includes five transistors 315a-315e, and a memristor 310. Further, the circuit 300 includes a match line ML, a word line WL that serves as ground, data line DL, and search-variance parameter lines F1 and F2. The memristor 310 (M1) that is coupled in series with the transistor 315a (T1) can be considered as a memristor-transistor pair M1/T1. This memristor-transistor pair can define a voltage divider that encodes the value when the memristor 310 is programmed (e.g., when the searched data matching the stored data is a function of the voltage divider characteristics). Thus, in this example, the memristor-transistor pair implements the analog search as the gate voltage of the transistor to create a variable-resistor divider where the memristor 310 is programmed to analog (stored) values that represent an analog number (or range). For example, the conductance of the memristor 310 can be used to store a target value ($V_{VAL}$) for the analog CAM's search, as described in detail in reference FIG. 2A.

Additionally, in the circuit 300, the input lines F1 and F2, which are configured for receiving the tunable search-variance parameters, are both transistor source lines. In the illustrated example, F1 is the source line for transistor 315b (T2), and F2 is the source line for transistor 315d (T4). The transistors 315a-315e can be implemented as metal-oxide semiconductor field-effect transistors (MOSFETs), for example.

Figure 4A:
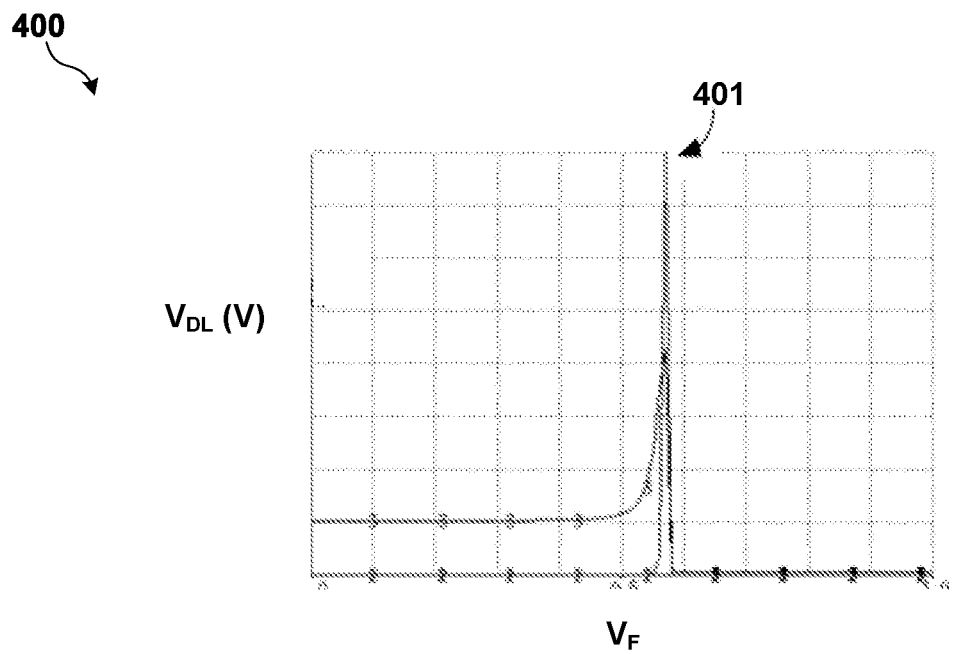
FIGS. 4A-4C are graphs depicting examples of graphically plotted relationships between analog values used for search input and different values used for programming the tunable search variance parameters of the analog CAM with search variance (or fuzziness) features, according to some embodiments.
Figure 4B:
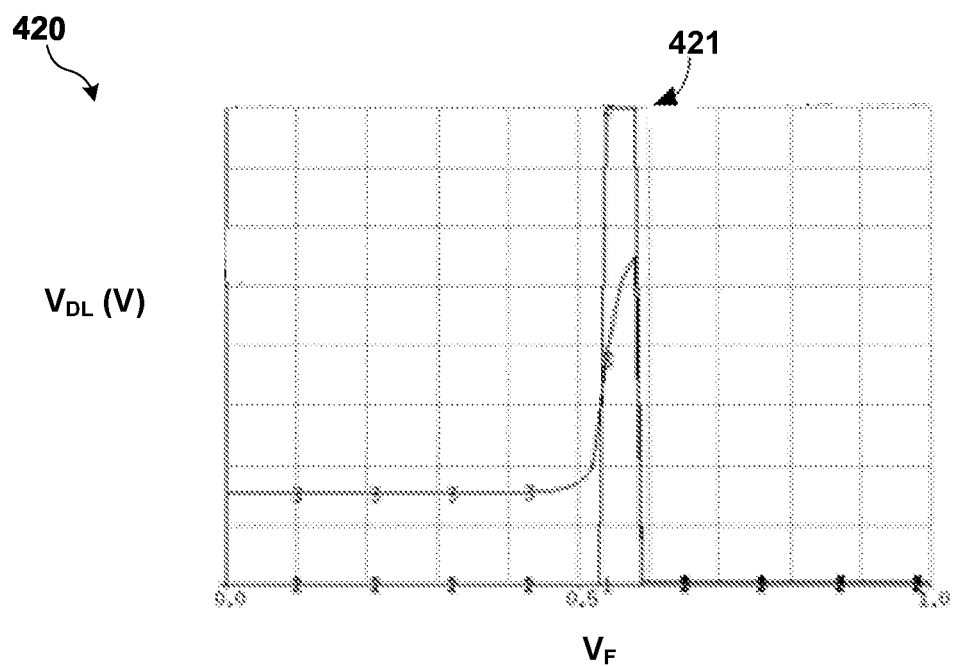
Figure 4C:
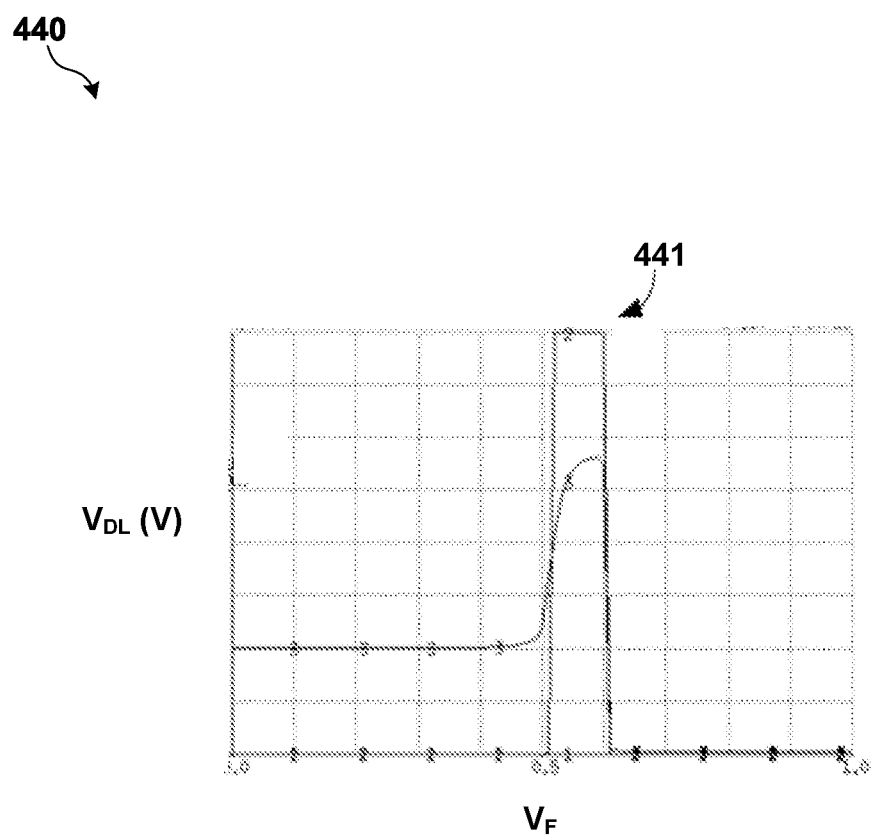

FIGS. 4A-4C show graphs that depict examples of relationships between the voltages received as search input and different values that can be used for programming the tunable variance-search parameters of the analog CAM. In each of the FIGS. 4A-4C, the respective graph plots the change in voltage representing the search input data ($V_{DL}$) along the y-axis against tunable variance-search parameters ($V_F$) along the x-axis, where the conductance (G) of the memristor is measured for 50 µS (e.g., in a simulation of a circuit). Turning to FIG. 4A, the graph 400 shows an example where the search-variance parameters are tuned to (+/−) 0.10V. Accordingly, the rise point of the plotted curve 401 is approximately at the point of 0.057 V and the fall is approximately at the same point of 0.057 V. Thus, the example curve 401 in graph 400 is a sharp spike, representing that the applied search-variance parameters define a variance range that has essentially no width. This can correspond to an analog CAM that has been programmed for a restrictive search, with little fuzziness (e.g., close to an exact match).

Turning to FIG. 4B, the graph 420 shows an example where the search-variance parameters are tuned to (+/−) 0.15V. Accordingly, the rise (e.g., lower bound) point of the plotted curve in 420 is approximately at the point of 0.054 V and the fall is approximately at the point of 0.058 V (e.g., upper bound). Thus, the curve 421 in graph 420 has some width, representing that the applied search-variance parameters define a variance range that has increased (as compared to FIG. 4A). This can correspond to an analog CAM that has been programmed for a less restrictive search, allowing a small fuzziness in determining a match.

In FIG. 4C, the graph 440 shows an example where the search-variance parameters are tuned to (+/−) 0.20V. Accordingly, the rise point of the plotted curve in 441 is approximately at the point of 0.052V and the fall is approximately at point of 0.059V. Thus, the curve 441 in graph 420 has an even larger width (compared to FIG. 4A and FIG. 4B), representing that the applied search-variance parameters define a variance range that has further increased (as compared to FIG. 4B). This can correspond to an analog CAM that has been programmed for a broad search, allowing for large degree of fuzziness in determining a match.

In some embodiments, two degrees of fuzziness can be tuned independently and predictably. That is, in the previous examples, the search-variance parameters were defined with respect to an offset from a centered value (e.g., target value). Furthermore, the upper bound and the lower bound had the same offset from the center, such as (+/−) 0.1 V. Alternatively, in this embodiment, the fuzziness has even greater adaptably, where the variance can be set to a specified value (as opposed to being a value, defined in relation to the memristor-stored value). For example, an upper bound for the search-variance parameters can be set to a specified $V_{hi}$ value, and the lower bound can be set to a specified $V_{io}$ value. Even further, $V_{hi}$ and $V_{io}$ are not necessarily the same offset, allowing the limits to have the flexibility of being set independently of each other (in some aspects). Additionally, either one of the $V_{hi}$ and $V_{io}$ values can be set to a fixed value (while the opposing value can be dynamically adjusted). Even further, in yet another embodiment, the $V_{hi}$ an $dV_{io}$ values can be programmed as open variables, or wildcard variables. As a result, a limit that corresponds to the wildcard variable (shown as "X" herein) can be considered as an "unbounded" limit of fuzziness. Matches determined for an analog CAM search using the tunable variance, or fuzziness, defined by $V_{hi}$ and $V_{io}$ can be represented mathematically as:

$$V_{hi} \leq V_{DL} \leq V_{io} \quad (4)$$

As an example, if the $V_{hi}$ is set to a wildcard "X" parameter, as known in programming, then the upper end of the variance is unbounded (or treated as a don't care) which essentially allows any hi voltage value to be considered a match. Examples of the various types of search-variance parameters described above, are shown in the table below:

| V(fuzz1) | V(fuzz2) | $V_{lo}$ | $V_{hi}$ |
|---|---|---|---|
| +0.10 | −0.10 | 0.57 | 0.57 |
| +0.15 | −0.10 | 0.54 | 0.57 |
| +0.20 | −0.10 | 0.52 | 0.57 |
| +0.25 | −0.10 | 0.49 | 0.57 |
| +0.30 | −0.10 | 0.46 | 0.57 |
| +0.35 | −0.10 | 0.41 | 0.57 |
| +0.40 | −0.10 | X | 0.57 |
| +0.10 | −0.15 | 0.57 | 0.58 |
| +0.10 | −0.20 | 0.57 | 0.60 |
| +0.10 | −0.25 | 0.57 | 0.62 |
| +0.10 | −0.30 | 0.57 | 0.66 |
| +0.10 | −0.35 | 0.57 | 0.74 |
| +0.10 | −0.40 | 0.57 | 0.92 |
| +0.10 | −0.45 | 0.57 | X |

Figure 5:
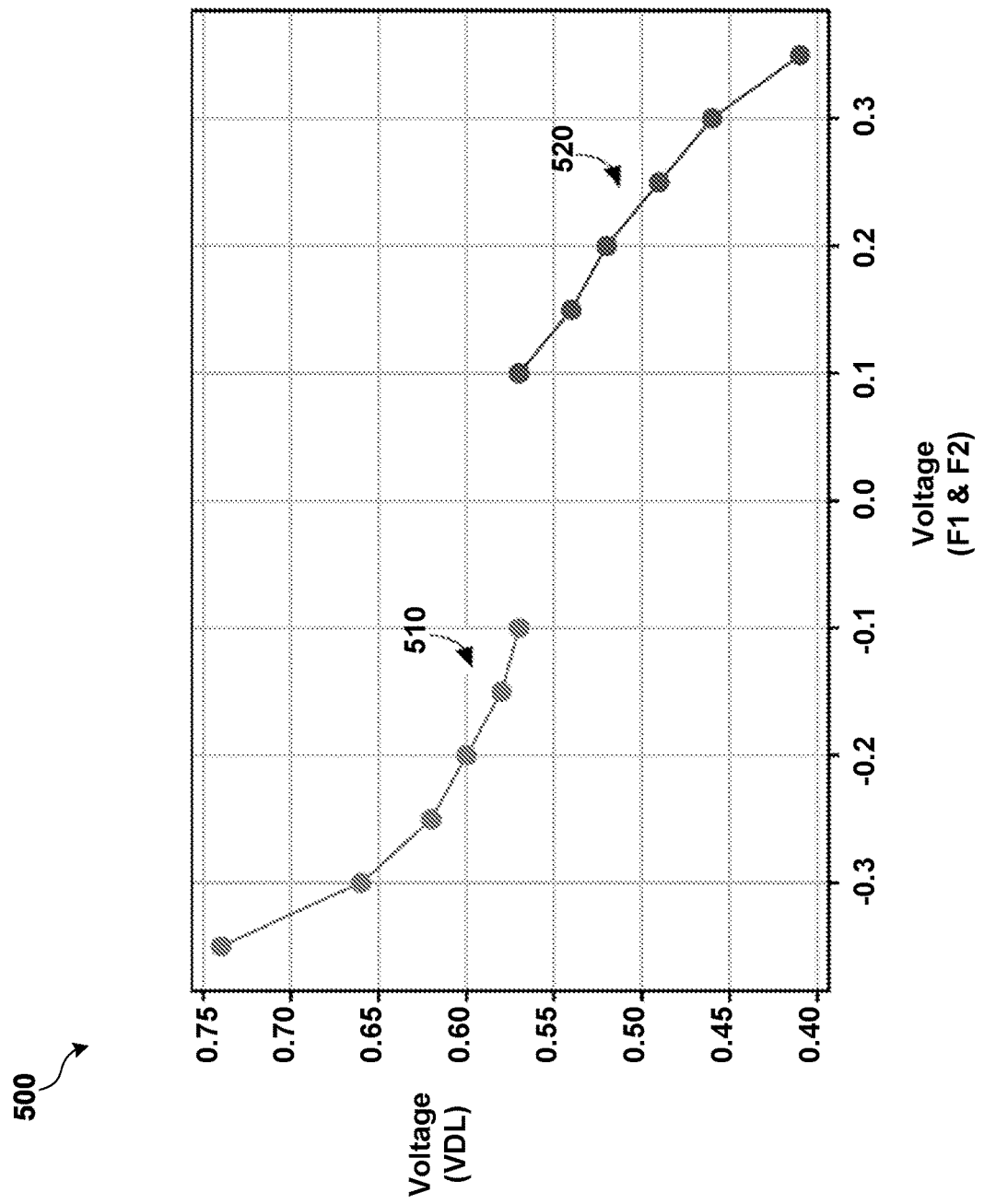
FIG. 5 is a graph depicting plotted points corresponding to different values that can be used for independently tuning each of the tunable search variance parameters for the analog CAM with fuzziness features, according to some embodiments.

FIG. 5 is a graph including plotted points corresponding to different values shown in table 1 to implement the tunable variances of the analog CAM with fuzziness features, according to some embodiments.

Figure 6A:
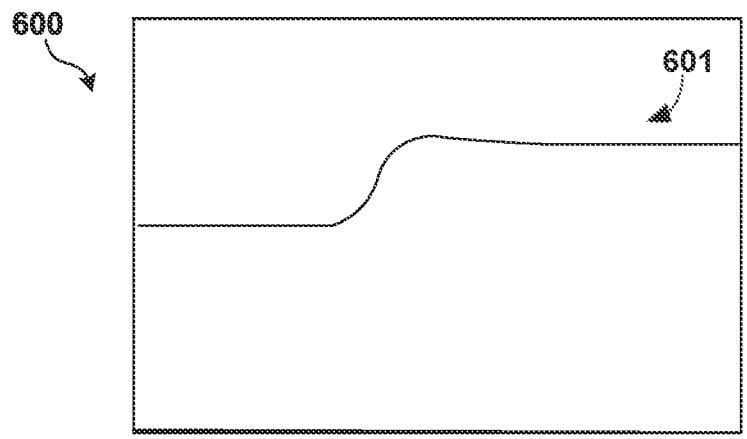
FIGS. 6A-6C are graphs depicting examples of graphically plotted relationships between analog values used for search input and open variables (also referred to herein as wildcards) used for programming the tunable search variance parameters of the analog CAM with search variance (or fuzziness) features, according to some embodiments.
Figure 6B:
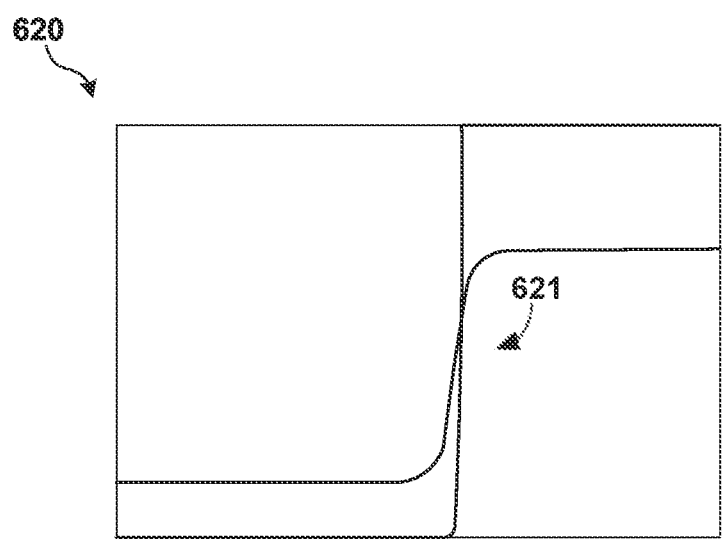
Figure 6C:
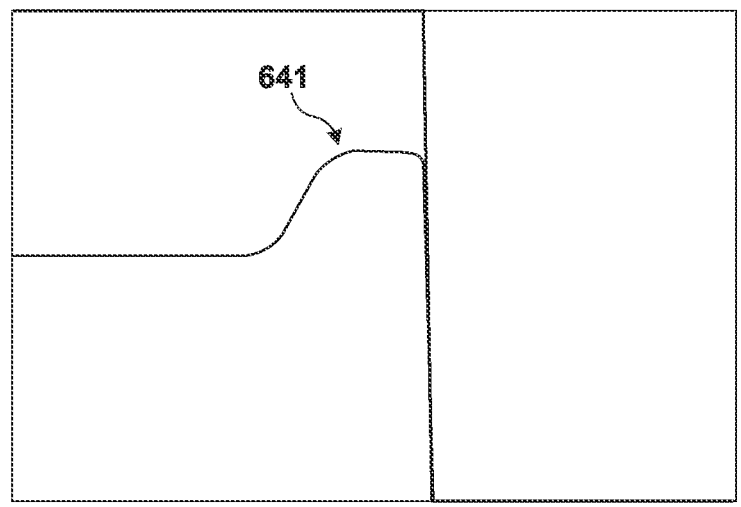

FIGS. 6A-6C show graphs 600, 620, and 640 respectively, depicting relationships between the voltages received as search input and open variables, or wildcards, that can be used for programming the tunable variance parameters of the analog CAM with fuzziness features. For example, in FIG. 6A, the graph 600 shows an open variance that can be programmed using the wildcards for upper and lower limits. The width of the curve 601 is unbounded on its upper limit and lower limit, which represents that a search has an open-ended variance and returns a match for all values of $V_{DL}$.

In FIG. 6B, the graph 620 shows an example of a variance with an upper bound that is set to an open variable. The width of the curve 621 has a lower bound, or rise of the curve, that starts at a point of 0.057V, and is unbounded on its upper limit. Thus, graph 620 represents that search-variable parameters can return a match for all values of $V_{DL}$>0.57V.

Now, referring to FIG. 6C, the graph 640 shows an example of a variance with a lower bound that is set to an open variable. The width of the curve 641 has an upper bound, or a fall of the curve, that starts at a point of 0.057V, and is unbounded on its lower limit. Thus, graph 640 represents that search-variable parameters can return a match for all values of $V_{DL}$<0.57V.

Figure 7A:
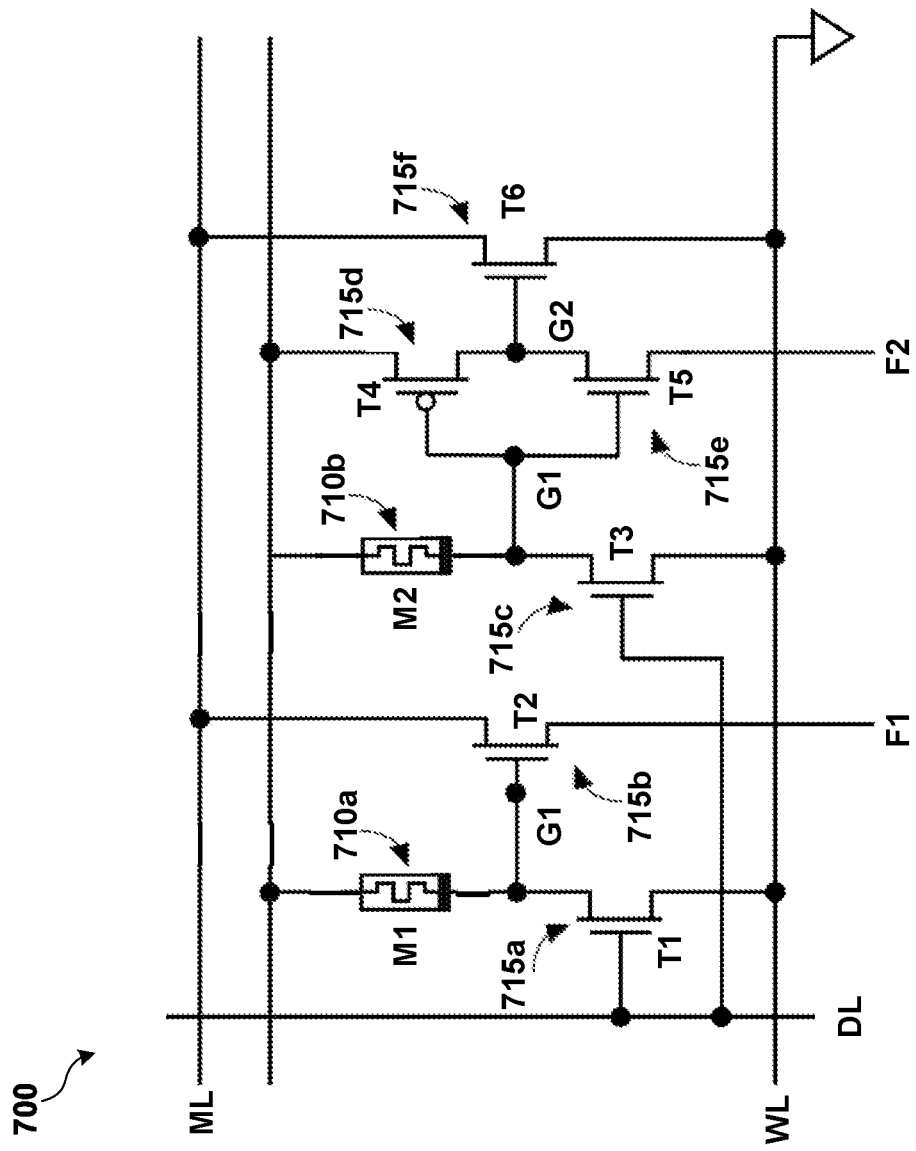
FIG. 7A illustrates another example of a circuit implementing an analog CAM cell, which is particularly configured to receive tunable search variance parameters via transistor source lines and to store a search range via memristors, according to some embodiments.

FIG. 7A illustrates another example configuration for a circuit 700 that can implement an analog CAM cell (shown in FIG. 2A). Particularly, the illustrated example shows a 6T2M configuration, where the circuit 700 includes six transistors 715a-715f, and two memristors 710a-710b. As seen in FIG. 7A, the line F1 is the source line for transistor 715b, and line F2 is the source line for transistor 715e. In this example, the lines F1 and F2 are employed to input the search-variance parameters.

Additionally, circuit 700 is configured to store a search range via memristors 710a-710b. When programmed, memristor 710a (M1) can store a high value for the range, and memristor 710b (M2) can store a low value for the range. In operation, an analog CAM may match values between the high value and the low value (or within the range) programmed into the memristors 710a-710b. Thus, circuit 700 is configured to implement two degrees of fuzziness, including a "static" range that is defined by the limits stored in the memristors 710a-710b, and a "dynamic" range that is defined by the limits input via lines F1 and F2 as tunable variance-search parameters. For example, M1 stores the range matrix, while F1 and F2 adds a range to the search vector. According to this embodiment, circuit 700 allows for both positive and negative values to be employed for the fuzziness features. This relationship between stored ranges and searched ranges that can be implemented by circuit 700, is further depicted in FIG. 7B.

Figure 7B:
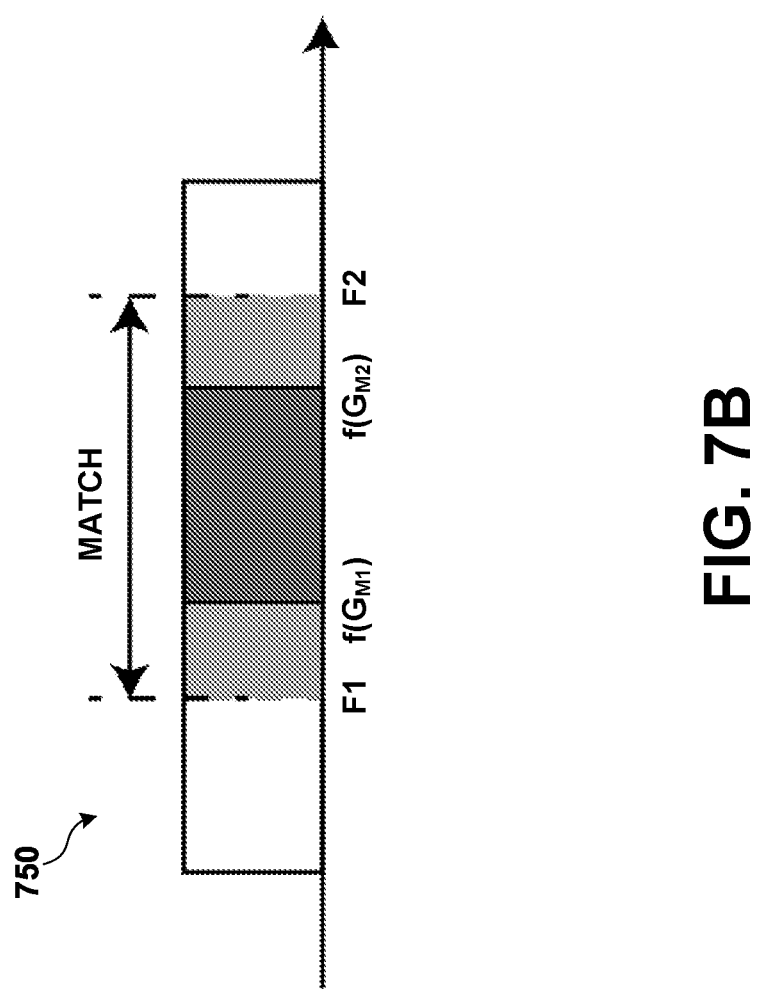
FIG. 7B is a conceptual diagram of an example range of voltages (e.g., variance range) that can be implemented by the analog CAM cell, as shown in FIG. 7A, to perform search operations that include a search variance (or fuzziness), according to some embodiments.

An example of a relationship between the "stored" search range and the "searched" range is shown in FIG. 7B. In the example, bar 750 is shown to include two shaded portions, an "inner" width (represented by the darker shaded portion of bar 750) and an "outer" width (represented by the lighter shaded portion of bar 750). The "inner" width represents a range of values that are stored, for instance using the memristor conductance. In FIG. 7B, the high value of the "stored" range is defined by $f(G_{M2})$ and low value defined by $f(G_{M1})$. The "outer" width represents the "searched" range, as defined by the search-variance parameters input into the cell. Accordingly, for a search to result in a match, the voltage ($V_{DL}$) applied on data line DL (representing the search input data) may be any voltage value that falls within the ranges of values corresponding to the "inner" width and the "outer" width. Furthermore, according to the example, due to the "stored" range being static, the "inner" width of bar 750 does not change (or the range remains the same). However, the "outer" width, corresponding to the tunable search-variance parameters are dynamic and thus can change. For instance, as the amount of allowed fuzziness is dynamically adjusted (via F1 and F2 inputs), this can be represented by the edges of the "outer" width, moving closer to (e.g., decreasing the variance range), or farther away from (e.g., increasing the variance range), the edges of the static "inner" width. This exemplifies the "two degrees" of fuzziness (static v. dynamic), that can be implemented by the embodiments.

Figure 8A:
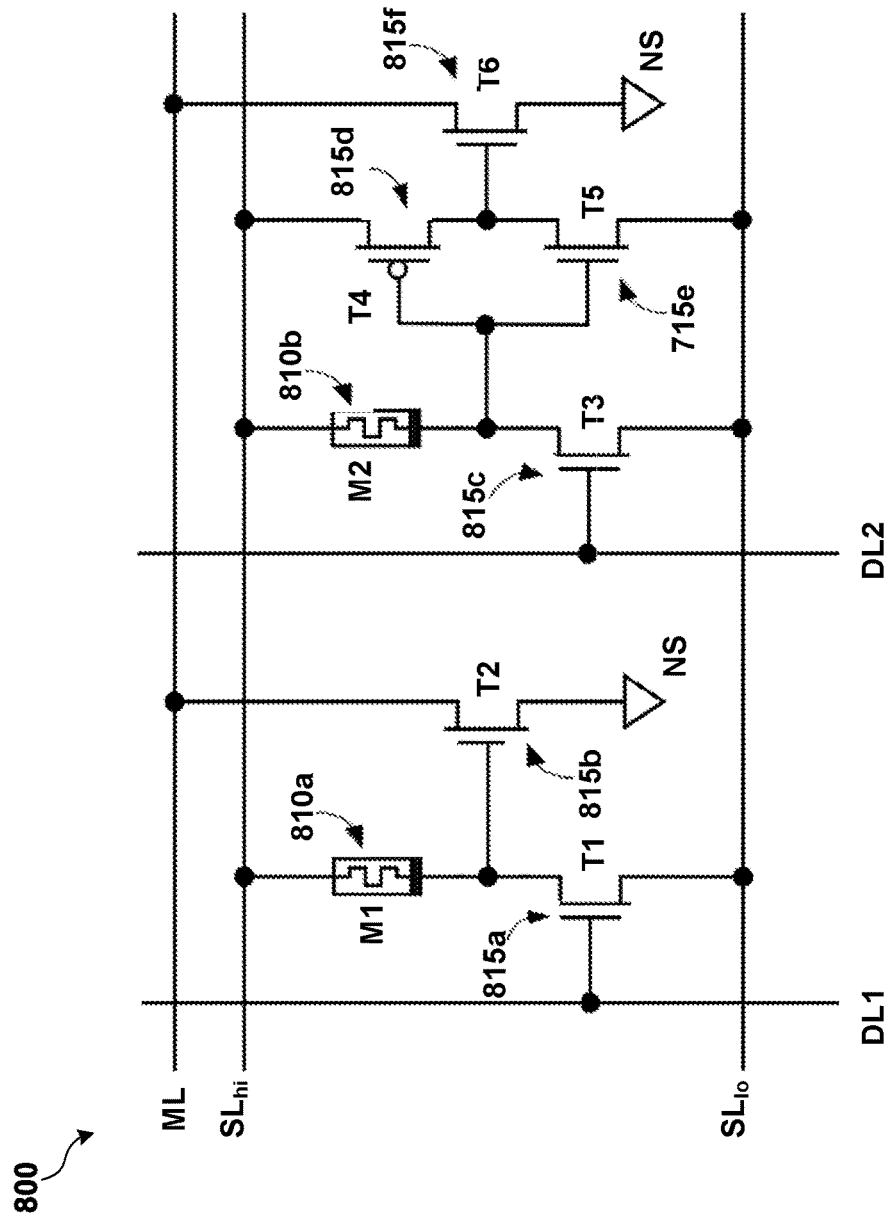
FIG. 8A illustrates another example of a circuit implementing an analog CAM cell, which is particularly configured to receive tunable search variance parameters via data lines and to store a search range via memristors, according to some embodiments.

Now referring to FIG. 8A, another example configuration for a circuit 800 implementing an analog CAM cell is shown. This circuit 800 has a 6T2M configuration, including memristors 810a, 810b, and six transistors 815a-815f. However, unlike previous embodiments, circuit 800 implements a search variance, or fuzziness, explicitly in the search. As previously described, in reference to FIG. 2A for example, an analog CAM cell can search a specific analog value ($V_{DL}$), while the search-variance parameters (F1 and F2), serve to effectively broaden the range of values stored in the analog CAM that can yield a match. In this case, the center of the match value is set by the target value ($V_{VAL}$) encoded in the memristor. In these embodiments, where the search-variance parameters are tied to the stored target value, fuzziness can be sensitive to an exact conductance value actually stored in the memristor. That is, in the event that the conductance fluctuates unexpectedly, this change may distort the variance range that is actually being implemented by the circuit versus the intended programmed variance (which may ultimately impact matches, and decrease accuracy). Therefore, an alternative, which is implemented by circuit 800, encodes the values defining the variance range directly into the search input (without being defined with respect to the stored target value).

As seen in FIG. 8A, this configuration uses two input lines DL1 and DL2 in its circuitry. Therefore, circuit 800 receives two input values via DL1 and DL2, which are used to set a range relating to the searched input data. Accordingly, this configuration does not utilize F1 and F2 driven on transistor source lines, as described in the previous embodiments, such as the circuit shown in FIG. 7A. In operation, the desired search range is input via DL1 and DL2, and the analog CAM cell matches when the input range has any overlap with the stored range, defined via the memristors conductances. This is assuming that DL2 is data low and conveys a voltage that is less than a voltage of DL1, which is data high for the range (e.g., $V_{DL2} < V_{DL1}$). In a case where DL1=DL2, then a match would result when the search input data falls within the range stored by the memristors 810a, 810b.

Figure 8B:
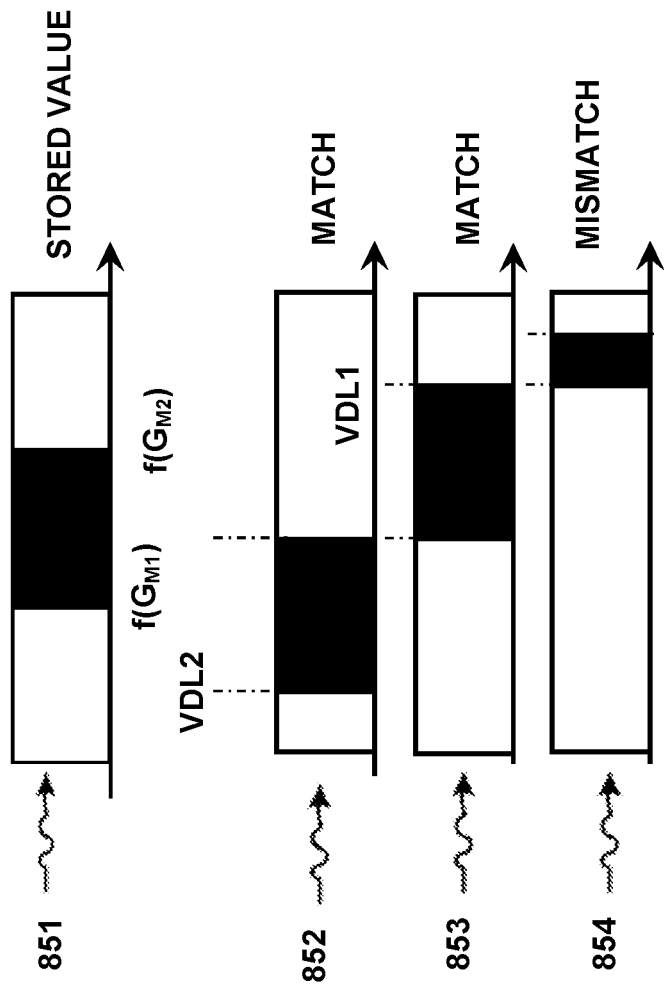
FIG. 8B is a conceptual diagram of an example range of voltages (e.g., variance range) that can be implemented by the analog CAM cell, as shown in FIG. 8A, to perform search operations that include a search variance (or fuzziness), according to some embodiments.

FIG. 8B is a conceptual diagram of examples of variance ranges that can be programmed for an analog CAM search. In particular, FIG. 8B depicts the relationship between ranges explicit in the search (input using D1 and D2) and stored ranges, which can be implemented by the circuit in FIG. 8A. The shaded portion of bar 851 represents the stored range, or width, which is defined by an upper limit encoded by the memristor conductance $f(G_{M2})$, and a low limit encoded by the memristor conductance $f(G_{M1})$. The shaded portion of bar 852 represents an example of a searched range, or width, which is defined by an upper limit set by an analog value encoded by data line D1 ($V_{DL1}$), and a lower limit set by an analog value encoded by data line D2 ($V_{DL2}$) As seen, there is overlap (near the lower bound) between the values that are stored, represented within the width of bar 851, and the values that are explicitly input as a searched range, within the width of bar 852. Similarly, there is an overlap (near the upper bound) between the values that are stored, represented within the width of bar 851, and another example of values that are explicitly input as a searched range depicted by bar 853 (having a width that is represented by the shaded portion of bar 853). Accordingly, a match would result in this case, using the search range depicted by bars 852 and 853. However, there is no overlap between the values that are stored, represented within the width of bar 851, and another example of values that are explicitly input as a searched range depicted by bar 854 (having a width that is represented by the shaded portion of bar 854). Consequently, there would be a mismatch using the search range depicted by bar 854.

As another example, the range of analog values that are defined by the search input data low and data high, can be described as already including the value (encoded by $V_{VAL}$ in previous embodiments) plus the allowed fuzziness. This differs from previously described embodiments, where the fuzziness is input as offsets from the stored target value. For example, in FIG. 8B, D1 and D2 could be set to 5.5V and 4.5V, respectively in order to program the range of values (in between 4.5V<V<5.5V) directly into the search. In contrast, the circuit of FIG. 3, for example, would receive values +0.5V and −0.5V on its F1 and F2 lines, and having a target analog value ($V_{VAL}$) of 5.0V that is encoded in its memristor in order to achieve a similar search operation.

According to the embodiments disclosed herein, the disclosed analog CAM realizes enhancements over existing TCAMs, for example, by having the capability to search its contents with a tunable uncertainty, or fuzziness. As alluded to above, these fuzziness features provide a functionality that is particularly efficient for applications involving a degree of uncertainty, such as genome sequencing, associative memory, probabilistic processing, and the like. Furthermore, there are embodiments that allow for multiple degrees of fuzziness, which employ both a stored variance range values, and a searchable variance range. According to these embodiments, the circuitry can have flexibility in its configuration, being set to perform a strict search operation akin to an "AND" operation (where the searched range is a subset of the stored range for a resulting match), or being set to perform a less restrictive search operation similar to an "OR" operation (where the searched range is any non-zero overlap of the stored range for resulting match).

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An analog content addressable memory (CAM) cell array, comprising:
   a first search-variance parameter line vertically aligned and coupled to a plurality of analog CAM cells, the first search-variance parameter line receiving a high voltage that is associated with an upper bound for a variance range from stored data to match input data during an analog CAM search operation; and
   a second search-variance parameter line vertically aligned and coupled to the plurality of analog CAM cells, the second search-variance parameter line receiving a low voltage that is associated with a lower bound for the variance range from the stored data to match the input data during the analog CAM search operation.

2. The analog CAM cell array of claim 1, wherein the stored data in each of the plurality of analog CAM cells is associated with a respective target voltage ($V_{VAL}$).

3. The analog CAM cell array of claim 2, wherein the variance range comprises voltage values that are greater than a sum of the low voltage received via the second search-variance parameter line and the $V_{VAL}$, and lower than a sum of the high voltage received via the first search-variance parameter line and the $V_{VAL}$.

4. The analog CAM cell array of claim 3, further comprising:
   an additional first search-variance parameter line vertically aligned and coupled to a plurality of additional analog CAM cells, the additional first search-variance parameter line receiving a high voltage that is associated with an upper bound for a variance range from the stored data to match the input data during the analog CAM search operation; and
   an additional second search-variance parameter line vertically aligned and coupled to the plurality of additional analog CAM cells, the additional second search-variance parameter line receiving a low voltage that is associated with a lower bound for the variance range from the stored data to match the input data during the analog CAM search operation.

5. The analog CAM cell array of claim 4, comprising:
   a first row including one of the plurality of analog CAM cells and one of the plurality of additional analog CAM cells; and
   a second row including another one of the plurality of analog CAM cells and another one of the plurality of additional analog CAM cells.

6. The analog CAM cell array of claim 5, wherein the stored data in each of the plurality of additional analog CAM cells is associated with a respective additional target voltage ($V_{VAL2}$), and wherein the variance range comprises voltage values that are greater than a sum of the low voltage received via the additional second search-variance parameter line and the $V_{VAL2}$, and lower than a sum of the high voltage received via the additional first search-variance parameter line and the $V_{VAL2}$.

7. The analog CAM cell array of claim 6, comprising:
   a first output line that is horizontally aligned and coupled to the plurality of analog CAM cells, the first output line outputting a first result of the analog CAM search operation based on the variance range for the stored data of each analog CAM cell within the first row; and
   a second output line that is horizontally aligned and coupled to the second row, the second output line outputting a second result of the analog CAM search operation based on the variance range for the stored data of each analog CAM cell within the second row.

8. The analog CAM cell array of claim 7, wherein the first output line outputs a match as the first result of the analog CAM search operation based on the variance range in response to each analog CAM cell within the first row matching the stored data of each analog CAM cell within the first row.

9. The analog CAM cell array of claim 7, wherein the second output line outputs a match as the second result of the analog CAM search operation based on the variance range in response to analog CAM cells within the second row matching the stored data of each analog CAM cell within the second row.

10. An analog content addressable memory (CAM) cell, comprising:
    a memristor storing an analog value associated with data stored in the analog CAM cell;
    a plurality of transistors;
    a data line receiving an applied voltage ($V_{DL}$) encoding input data for searching the data stored in the analog CAM cell; and
    a plurality of search-variance parameter lines vertically aligned and coupled to a transistor of the plurality of transistors, the plurality of search-variance parameter lines comprising transistor source lines to determine a variance range from the stored data to match the input data.

11. The analog CAM cell of claim 10, wherein the memristor stores the analog value associated with a target voltage ($V_{VAL}$) via a conductance of the memristor.

12. The analog CAM cell of claim 11, wherein the variance range comprises voltage values that are greater than a sum of a low voltage received via a first search-variance parameter line of the plurality of search-variance parameter lines and the $V_{VAL}$, and lower than a sum of the high voltage received via a second search-variance parameter line of the plurality of search-variance parameter lines and the $V_{VAL}$.

13. The analog CAM cell of claim 12, wherein the $V_{DL}$ is a value within the variance range that matches the data stored in the analog CAM cell.

14. The analog CAM cell of claim 10, further comprising:
    an additional memristor storing an additional analog value associated with the data stored in the analog CAM cell.

15. The analog CAM cell of claim 14, wherein the memristor stores the analog value via a first corresponding conductance to set a low limit ($G_{M1}$) for a stored search range, and further wherein the additional memristor stores an additional analog value via a second conductance to set a high limit for a stored search range ($G_{M2}$).

16. The analog CAM cell of claim 15, wherein the variance range comprises voltage values that are greater than a difference of $G_{M1}$ and a low voltage received via a first search-variance parameter line of the plurality of search-variance parameter lines, and lower than a sum of $G_{M2}$ and a high voltage received via a second search-variance parameter line of the plurality of search-variance parameter lines, and the $V_{DL}$ is a value that is within the variance range to match the data stored in the analog CAM cell.

17. The analog CAM cell of claim 16, wherein the stored search range is statically stored via the memristor and the additional memristor, and the variance range is dynamically adjusted based on the voltages received via the first search-variance parameter line of the plurality of search-variance parameter lines and the second search-variance parameter line of the plurality of search-variance parameter lines.

18. An analog content addressable memory (CAM) cell, comprising:
    a plurality of memristors storing a plurality of analog values to set one or more limits for a stored search range associated with data stored in the analog CAM cell;
    a first data line receiving a high voltage that is associated with input data for searching the data stored in the analog CAM cell including a high limit for a variance range to match the input data to the data stored in the analog CAM cell; and
    a second data line receiving a low voltage that is associated with the input data for searching the data stored in the analog CAM cell including a low limit for the variance range to match the input data to the data stored in the analog CAM cell.

19. The analog CAM cell of claim 18, wherein a non-zero overlap between the stored search range and the variance range including the high limit received via the first data line and the low limit received via the second data line results in a match of the input data to the data stored in the analog CAM cell.

20. The analog CAM cell of claim 18, wherein a first memristor of the plurality of memristors stores a first analog value of the plurality of analog values via a corresponding conductance to set a low limit ($G_{M1}$) for the stored search range, and further wherein a second memristor of the plurality of memristors stores a second analog value of the plurality of analog values via a corresponding conductance to set a high limit for the stored search range ($G_{M2}$).

\* \* \* \* \*